US008114700B2

(12) United States Patent
Miyashita et al.

(10) Patent No.: US 8,114,700 B2
(45) Date of Patent: Feb. 14, 2012

(54) METHOD OF FABRICATING AN ULTRA-SMALL CONDENSER MICROPHONE

(75) Inventors: Yoshiyuki Miyashita, Niigata (JP); Kazumoto Doi, Kanagawa (JP); Tadao Imai, Niigata (JP); Hiroaki Iwaseki, Niigata (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/917,916

(22) Filed: Nov. 2, 2010

(65) Prior Publication Data

US 2011/0045616 A1 Feb. 24, 2011

Related U.S. Application Data

(62) Division of application No. 12/265,431, filed on Nov. 5, 2008, now Pat. No. 7,855,095.

(30) Foreign Application Priority Data

Nov. 16, 2007 (JP) ................................ 2007-297687

(51) Int. Cl.
*H01L 21/00* (2006.01)
*H04R 31/00* (2006.01)

(52) U.S. Cl. .......... 438/53; 438/113; 438/460; 257/416; 29/594

(58) Field of Classification Search .................... 438/48, 438/50, 51, 53, 57, 64, 66–68, 106, 110, 438/113, 118, 460–465; 257/416; 29/594
See application file for complete search history.

(56) References Cited

U.S. PATENT DOCUMENTS 7,080,442 B2 7/2006 Kawamura et al.
2007/0258605 A1 11/2007 Tsuchiya
2007/0274544 A1 11/2007 Takeuchi et al.

FOREIGN PATENT DOCUMENTS

EP 1843631 A2 10/2007
JP 2007-294858 11/2007
JP 2008-112755 5/2008
WO WO 2006/132193 A1 12/2006

OTHER PUBLICATIONS

U.S. Appl. No. 12/265,453, filed Nov. 5, 2008, Miyashita, et al.

*Primary Examiner* — Charles Garber
*Assistant Examiner* — Calvin Choi
(74) *Attorney, Agent, or Firm* — McDermott Will & Emery LLP

(57) ABSTRACT

In the present invention, a semiconductor substrate wherein a plurality of MEMS microphones is formed is disposed opposed to a discharge electrode in a state of being stuck on a sheet. Electretization of a dielectric film provided in the MEMS microphone is performed by irradiating the dielectric film between a fixed electrode and a vibration film provided in the MEMS microphone with ions resulting from a corona discharge of the discharge electrode in a state that a predetermined potential difference is applied to the fixed electrode and the vibration film and fixing charges based on the ions to the dielectric film. The electretization is successively performed to each MEMS microphone on the semiconductor substrate by relatively moving the semiconductor substrate and the discharge electrode. Therefore, electretization of the dielectric film in the MEMS microphone chip is realized using a low-cost and simple fabricating equipment and productivity can be enhanced.

30 Claims, 7 Drawing Sheets

METHOD OF FABRICATING AN ULTRA-SMALL CONDENSER MICROPHONE

CROSS-REFERENCE TO RELATED APPLICATIONS

The present application is a Divisional of U.S. patent application Ser. No. 12/265,431, filed on Nov. 5, 2008, now U.S. Pat. No. 7,855,095 and claims the benefit of patent application number 2007-297687, filed in Japan on Nov. 16, 2007, the entire contents of each of which is incorporated herein by reference.

BACKGROUND OF THE INVENTION

1. Field of the Invention

The present invention relates to a method of fabricating an ultra-small condenser microphone using a semiconductor process technology.

2. Description of the Related Art

An electret condenser microphone (ECM) is an acousto-electric transducer wherein an electret film having a semi-permanent electric polarity is formed by electretizing, and a DC (direct current) bias voltage is not needed to be applied to both electrodes of a condenser. An electret film is formed by electrically charging a dielectric film and fixing charges in the dielectric film so that a potential difference is generated between both electrodes by an electric field occurred by the fixed charges. Hereinafter, to fix charges in the dielectric film is referred to as 'electretization' and an amount of fixed charges is referred to as 'an amount of deposited charges'.

FIG. 12 is a schematic cross-sectional view showing a principal part of a conventional electretization apparatus used for electretizing a dielectric film by injecting charges to form an electret film. In the apparatus shown in FIG. 12, a dielectric film is electretized by causing a corona discharge using a needle electrode. As shown in FIG. 12, a dielectric film 4 to be electretized is disposed on a ground electrode (a metal tray) 5. In this state, a high voltage power source 7 applies a DC voltage to a needle electrode 6 arranged opposite to the ground electrode 5, thereby causing the DC corona discharge between the needle electrodes 6 and the ground electrode 5. Electretization is performed by charging and fixing ions resulting from the DC corona discharge in the dielectric film 4 (for example, see Japanese Patent Laid-Open Publication No. 2007-294858).

In resent years, ultra-small condenser microphones have been fabricated by processing silicon substrates utilizing a micro-processing technology for semiconductor integrated circuits. Such ultra-small condenser microphones have received attention as micro-electro-mechanical system (MEMS) microphones (hereinafter referred to as MEMS microphones). MEMS microphones are incorporatedly formed on a silicon substrate using a semiconductor process technology, so that it is impossible that a dielectric film alone is taken out from the microphones and separately electretized. Therefore, the electretization apparatus shown in FIG. 12 can not be adopted.

The above mentioned Japanese Patent Laid-Open Publication No. 2007-294858 discloses that a dielectric film is electretized in a state that a MEMS microphone chip formed by micro-processing a silicon wafer is mounted on a substrate for packaging or in a state of an individual MEMS microphone chip which is separated by cutting a semiconductor substrate. In this technology, a dielectric film provided in a MEMS microphone chip is electretized by applying a corona discharge at least a time to a single or several MEMS microphone chips simultaneously by a needle electrode or a wire electrode.

FIG. 1 is a cross-sectional view showing a structure of a MEMS microphone chip fabricated by processing a silicon wafer using a semiconductor process technology. As shown in FIG. 1, a MEMS microphone chip 43 has a base 34 made of a silicon wafer (silicon diaphragm) having an opening in the center part. The opening in the base 34 is blocked by a vibration film 33. An inorganic dielectric film 32 which is an object to be electretized is formed on a surface of the vibration film 33 opposite the surface in contact with the base 34 located. A fixed electrode 31 supported by a spacer 37 is arranged to be opposed to the inorganic dielectric film 32. The fixed electrode 31 has a plurality of acoustic holes 35 (openings for transmitting an acoustic wave to the vibration film 33). An air gap 36 is provided between the inorganic dielectric film 32 and the fixed electrode 31. The air gap 36 is formed by etching and removing a sacrificial layer embedded that area in a fabricating process of the silicon wafer. In this structure, the vibration film 33 functions as one of electrodes of a condenser and the fixed electrode 31 functions as the other one of electrodes of the condenser. The silicon wafer supports only the outskirts of the vibration film 33 and the surface of the vibration film 33 is exposed from the opening of the silicon wafer.

FIG. 2 is a plan view showing the MEMS microphone chip 43 in FIG. 1. FIG. 1 is a cross-sectional view taken along A-A line in FIG. 2. As shown in FIG. 2, pads 40, 41 and 42 are formed on the surface having the inorganic dielectric film 32 in the base 34. The pad 40 is electrically connected to the fixed electrode 31 (not shown). The pad 41 is connected to the vibration film 33 by an interconnection passed through the spacer 37, and the pad 42 is electrically connected to the silicon wafer 34. The pads 40, 41 and 42 are utilized to make contact with probe pins in inspections and are utilized for wire bonding in assembling.

SUMMARY OF THE INVENTION

In the above-discussed MEMS microphone, a dielectric film is electretized in a state that a MEMS microphone chip is mounted on the substrate for packaging or an individual MEMS microphone chip is diced. Thus, in the conventional electretization process, a MEMS microphone chip which is mounted on the substrate for packaging or diced (hereinafter referred to as a partially fabricated MEMS microphone) is transferred one by one from a supply tray and placed onto a position for processing and electretized with being held at that position. The electretized partially fabricated MEMS microphone is then transferred and held at a position to inspect an amount of deposited charges. After the inspection, the MEMS microphones are classified by a defective or a non-defective based on the inspection result and loaded onto trays according to the classifications.

In the mounted MEMS microphone chip, wires electrically connecting the MEMS microphone chip 43 with the substrate for packaging and other elements are exposed. While, the individualized MEMS microphone chip is a compound body containing the frame-shaped base 34, the air gap 36, the fixed electrode 31 comprised of a thin film, and the vibration film 33 comprised of a thin film. Therefore, the partially fabricated MEMS microphone chips are extremely apt to be damaged by outer stress. For this reason, a collet and the like can absorb the limited portions of the partially fabricated MEMS microphone for transferring and can grip the limited portions thereof for holding as described above. It is necessary to enhance accuracy of positioning by image recognition and the like and to adjust a stress to be added within an extremely narrow range in order to absorb or grip the limited portions securely.

Under the circumstances, production equipments which are used in the electretization process or in the assembling process thereafter should have been provided with a delicate and complicated mechanism in order to transfer and hold partially fabricated MEMS microphones having an extremely vulnerable structure in the past. In the production equipments, a difficulty in processing in high speed results in low throughput and gives limitations to enhance productivity. Therefore, it is difficult to utilize handlers and the like generally used for an assembly process of semiconductor integrated circuits, thereby increasing the equipment cost.

The present invention is suggested in consideration of the above discussed problems and has an object to provide a fabricating method of an ultra-small condenser microphone wherein a electretization process of a dielectric film of a MEMS microphone chip can be realized with low-cost and a simple equipment and productivity can be enhanced.

The present invention adopts following technical methods in order to solve the above-discussed problems and accomplish the objects. Firstly, the present invention is assumed that a method of fabricating an ultra-small condenser microphone including a vibration film of which an outer edge is supported by a base formed of a semiconductor substrate, a dielectric film formed on the vibration film and a fixed electrode arranged above the dielectric film via a space. Then, in a method of fabricating the ultra-small condenser microphone relating to the present invention, a sheet is stuck on an opposite surface of a surface whereon the vibration film is formed in the semiconductor substrate wherein a plurality of the ultra-small condenser microphones is formed. Next, the semiconductor substrate stuck on the sheet is disposed opposed to a discharge electrode. The dielectric film provided in the ultra-small condenser microphone on the disposed semiconductor substrate is electretized. The electretization for fixing charges in the dielectric film is realized by irradiating the dielectric film placed between the fixed electrode and the vibration film with ions resulting from a corona discharge of the discharge electrode in a state that a predetermined potential difference is given between the fixed electrode and the vibration film. The electretization for the dielectric film provided in the plurality of ultra-small condenser microphones on the semiconductor substrate is successively performed by relatively moving the semiconductor substrate and the discharge electrode.

In accordance with the method of an ultra-small condenser microphone, a plurality of ultra-small condenser microphones formed on a single substrate is electretized in a state of a substrate with a simple structure and without damaging the ultra-small condenser microphones.

Further, in other method of fabricating an ultra-small condenser microphone relating to the present invention, a sheet is stuck on an opposite surface of a surface whereon the vibration film is formed in the semiconductor substrate wherein a plurality of the ultra-small condenser microphones is formed. Next, the semiconductor substrate stuck on the sheet is disposed opposed to a discharge electrode. The dielectric film provided in the ultra-small condenser microphone on the disposed semiconductor substrate is electretized. The electretization for fixing charges in the dielectric film is realized by irradiating the dielectric film placed between the fixed electrode and the vibration film with ions resulting from a corona discharge of the discharge electrode in a state that a predetermined potential difference is given between the fixed electrode and the vibration film. Further, an inspection to inspect an amount of charges deposited in the dielectric film provided in an ultra-small condenser microphone completed the electretization on the semiconductor substrate is performed in parallel with the electretization. Then, the electretization for the dielectric film provided in the plurality of the ultra-small condenser microphones on the semiconductor substrate and the inspection of an amount of deposited charges in the dielectric film completed the electretization on the semiconductor substrate are successively performed by relatively moving the semiconductor substrate and the discharge electrode.

In accordance with the method of an ultra-small condenser microphone, a plurality of ultra-small condenser microphones formed on a single substrate is electretized in a state of a substrate and the amount of deposited charges is inspected in a state of a substrate with a simple structure and without damaging the ultra-small condenser microphones. Moreover, the inspection of the amount of deposited charges is performed in parallel with electretization, thereby productivity can be further enhanced.

Preferably, the semiconductor substrate and the discharge electrode move relatively in a time interval of that an amount of charges deposited in the dielectric film reaches a predetermined amount, and the above-described electretization is performed continuously. Also, preferably, the semiconductor substrate and the discharge electrode move relatively in a time interval required for the inspection of the amount of deposited charges, and the above-described electretization is performed continuously.

In the above inspection of the amount of deposited charges, a structure of measuring a capacitance of a condenser composed of the fixed electrode and the vibration film in every potential difference by changing the potential difference given between the fixed electrode and the vibration film in one direction within a predetermined range is adopted. In such a case, a potential difference of which a decreasing rate of the capacitance relative to the increase in the potential difference is maximum and a potential difference of which an increasing rate of the capacitance relative to the increase in the potential difference is maximum are obtained based on the measured capacitance, and the amount of deposited charges is inspected based on an intermediate value of the obtained respective potential differences. Preferably, the capacitance is measured by reducing a variation of the potential difference given between the fixed electrode and the vibration film around the potential difference of which the decreasing rate of the capacitance relative to the increase in the potential difference is maximum and the potential difference of which the increasing rate of the capacitance relative to the increase in the potential difference is maximum, thereby accurately inspecting the amount of deposited charges. Moreover, in finishing giving the potential difference to measure the capacitance, it is preferable that the potential difference to measure the capacitance is finished to give after a potential difference corresponding to the intermediate value is given to the fixed electrode and the vibration film. Accordingly, the inspection of the amount of deposited charges can be finished as a steady-state wherein load is not given to the vibration film of the ultra-small condenser microphone. Moreover, in giving the potential difference to measure the capacitance, it is preferable that the same potential given to the fixed electrode is applied to the base supporting the outer edge of the vibration film so as to stably measure the capacitance.

Further, it is preferable that at least one or more chips are interposed between an ultra-small condenser microphone to be electretized and an ultra-small condenser microphone to be inspected the amount of deposited charges in parallel with the electretization on the semiconductor substrate.

Furthermore, a needle electrode of which a tip is opposed to the semiconductor substrate can be adopted to a discharge electrode.

Well, in other method of fabricating an ultra-small condenser microphone relating to the present invention, a sheet is stuck on an opposite surface of a surface whereon the vibration film is formed in the semiconductor substrate wherein a plurality of the ultra-small condenser microphones is formed. Next, the semiconductor substrate stuck on the sheet is disposed opposed to a tip of a needle discharge electrode. The dielectric film provided in the ultra-small condenser microphone on the disposed semiconductor substrate is electretized. Here, electretization for fixing charges in the dielectric film is performed simultaneously to a plurality of the ultra-small condenser microphones which is all contained in an area where ions resulting from a corona discharge of the needle discharge electrode are to be reached on the semiconductor substrate. The electretization is performed by irradiating each dielectric film between each fixed electrode and each vibration film with the ions and fixing charges based on the ions in each dielectric film in a state that a predetermined potential difference is given between each fixed electrode and each vibration film.

Further, in other method of fabricating an ultra-small condenser microphone relating to the present invention, a sheet is stuck on an opposite surface of a surface whereon the vibration film is formed in the semiconductor substrate wherein a plurality of the ultra-small condenser microphones is formed. Next, the semiconductor substrate stuck on the sheet is disposed opposed to a linear discharge electrode. The dielectric film provided in the ultra-small condenser microphone on the disposed semiconductor substrate is electretized. Here, electretization for fixing charges in the dielectric film is performed simultaneously to a plurality of the ultra-small condenser microphones which is all contained in an area where ions resulting from the corona discharge of the linear discharge electrode are to be reached on the semiconductor substrate. The electretization is performed by irradiating each dielectric film between each fixed electrode and each vibration film with the ions and fixing charges based on the ions in each dielectric film in a state that a predetermined potential difference is given between each fixed electrode and each vibration film.

In the above-discussed method of fabricating an ultra-small condenser microphone, the ultra-small condenser microphone to be electretized is selected by giving the potential difference between the fixed electrode and the vibration film and in parallel a time to electretize is adjusted with a time to give the potential difference. Further, a ground potential may be given to the fixed electrode and the vibration film before giving the potential difference between the fixed electrode and the vibration film so as to remove static electricity.

Further, the predetermined potential difference can be given between the fixed electrode and the vibration film through probe pins, for instance. Then, it is preferable that a probe card supporting the probe pins is provided with a cover having conductivity connected to a ground potential through a high resistance. The cover has a function to prevent ion irradiation on the dielectric film provided in an ultra-small condenser microphone except for an ultra-small condenser microphone to be electretized. Preferably, frosted black coating is applied to a surface of the cover opposed to the semiconductor substrate. Additionally, it is preferable that the probe pins are set through portions except for above the fixed electrode provided in an ultra-small condenser microphone to be electretized. In the same manner, the inspection of the amount of deposited charges can be performed through probe pins.

In order to prevent oxidation of the probe pins, a structure that an ion-shielding shutter having conductivity connected to a ground potential opens/closes a path of ions resulting from the discharge electrode to the semiconductor substrate can be adopted. Besides, a structure as below as well prevents oxidation of the probe pins in a case that a plurality of the ultra-small condenser microphones is electretized simultaneously. Namely, using a relay and the like for switching a conducting state and a non-conducting state interposed in each electrical path to apply a voltage in order to give the predetermined potential difference to the fixed electrode and the vibration film provided in each of the ultra-small condenser microphones to be simultaneously electretized, a part of the electrical paths is to be the non-conducting state in order to stop giving the potential difference selectively. The relay and the like may be arranged on a probe card or on a board to which the probe card is connected.

Additionally, the method of fabricating the ultra-small condenser microphone as discussed above is accomplished by arranging the discharge electrode in a wafer prober and the semiconductor substrate wherein the plurality of the ultra-small condenser microphones is formed is disposed on a stage provided in the wafer prober. In this case, preferably, a distance between the disposed semiconductor substrate and the discharge electrode is adjustable. The distance can be adjusted based on a scale which specifies a position of the discharge electrode.

In the above-discussed method of fabricating the ultra-small condenser microphone, it is applicable in a state that the semiconductor substrate stuck on the sheet is separated into pieces on the sheet and the separated semiconductor substrates are held together by the sheet.

In accordance with the present invention, each ultra-small condenser microphone is successively electretized in a short time and productivity thereof can be significantly enhanced as MEMS microphone chips are electretized in a state of a substrate. On the other hand, although a handler equipment on the market and the like which are frequently used for inspections of semiconductor integrated circuit devices in a state that an ultra-small condenser microphone is diced cannot be utilized as the diced ultra-small condenser microphones are damaged in the prior art, a wafer prober on the market frequently used for inspections of a state of a substrate of semiconductor integrated circuit devices can be used in accordance with the present invention. Therefore, an equipment cost can be reduced.

The foregoing and other objects, features, aspects and advantages of the present invention will become more apparent from the following detailed description of the present invention when taken in conjunction with the accompanying drawings.

DETAILED DESCRIPTION OF PREFERRED EMBODIMENTS

Figure 1:
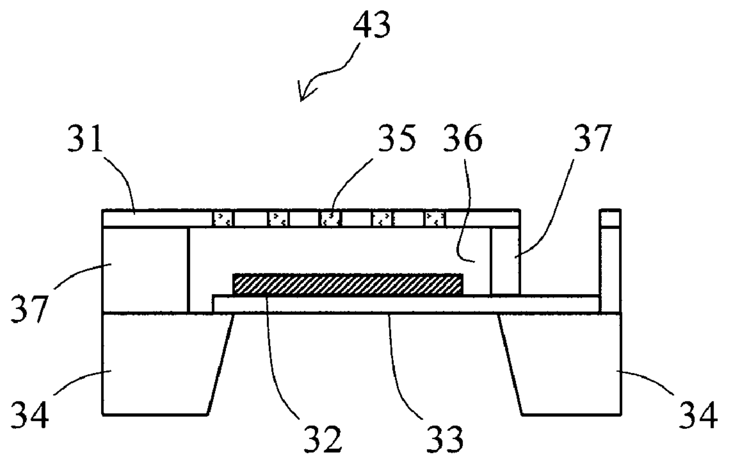
FIG. 1 is a cross-sectional view showing a MEMS microphone chip.
Figure 2:
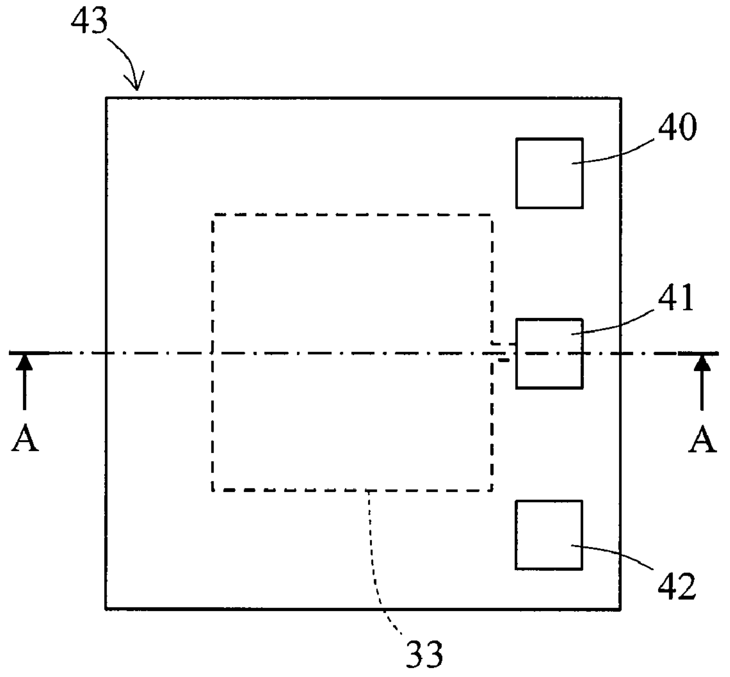
FIG. 2 is a plan view showing a MEMS microphone chip.

Embodiments of the present invention will be described in detail hereinafter with reference to the drawings. In the following embodiments, the present invention is embodied in an electretization process in a fabricating process of an ultra-small condenser microphone (a MEMS microphone) as shown in FIGS. 1 and 2.

In an electretization process in a fabricating process of an ultra-small condenser microphone in accordance with the present invention, an electrical potential is applied to each electrode of a MEMS microphone chip which is an object to be electretized and a corona discharge is generated above a fixed electrode in a state that a plurality of MEMS microphone chips is incorporatedly formed on a same substrate. Ions resulting from the corona discharge reach a dielectric film through acoustic holes on the fixed electrode, and the dielectric film is electretized. In the meantime, an inspection to measure an amount of deposited charges of other MEMS microphone chips may be performed in parallel with electretization of a MEMS microphone chip in an electretization process. Further, a plurality of MEMS microphone chips is irradiated by ions resulting from a corona discharge so that a plurality of MEMS microphone chips can be simultaneously electretized. In such a case, in parallel, the amount of deposited charges of other plurality of MEMS microphone chips, which are on the same substrate but are different from a plurality of MEMS microphone chips irradiated by ions, may be measured. Embodiments of a fabricating method of an ultra-small condenser microphone in the present invention as described above will be discussed in detail hereinafter with reference to the drawings.

First Embodiment

Figure 3:
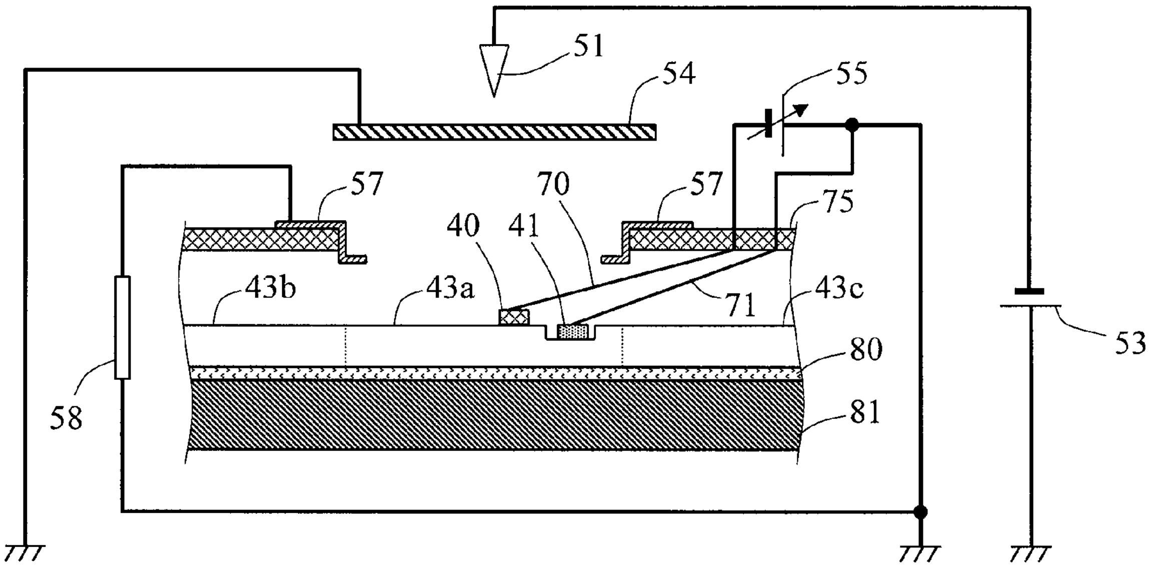
FIG. 3 is a cross-sectional view showing a principal part of an electretization apparatus that relates to the first embodiment of the present invention.

FIG. 3 is a schematic cross-sectional view showing a principal part of a structure of an electretization apparatus used for an electretization process of an ultra-small condenser microphone in accordance with a first embodiment of the present invention. In the electretization apparatus in FIG. 3, a plurality of ultra-small condenser microphones (MEMS microphones), which is formed on a same semiconductor substrate, in a state of a substrate not being diced is electretized. The electretization to a MEMS microphone chip is performed by irradiating a single MEMS microphone chip formed on the semiconductor substrate with ions resulting from a corona discharge of a single needle electrode in this apparatus.

As shown in FIG. 3, the electretization apparatus in this embodiment is provided with a stage 81 on which a semiconductor substrate having a plurality of MEMS microphone chips 43 (only MEMS microphone chips 43*a*, 43*b* and 43*c* are shown in FIG. 3) is disposed. The stage 81 has a structure of being movable in horizontal and up-and-down directions. In an opposite position to the stage 81, a needle electrode (a discharge electrode) 51 is arranged. A high voltage power source 53 is connected to the needle electrode 51 so as to cause a corona discharge. The needle electrode 51 has a structure of being movable in a perpendicular direction so as to adjust the height from the semiconductor substrate disposed on the stage 81. A probe card 75 having probe pins 70 and 71 which are arranged according to an arrangement of pads 40 and 41 formed on the MEMS microphone chip 43 is fixed between the stage 81 and the needle electrode 51. The probe card 75 has an opening as a path to enable ions resulting from the corona discharge to reach the semiconductor substrate disposed on the stage 81. The probe pin 71 is connected to a ground potential. The probe pins 70 and 71 are connected to a variable voltage power source 55 which gives a potential difference between the probe pins 70 and 71.

This electretization apparatus performs electretization in the state that the semiconductor substrate on which the MEMS microphone chips which are objects to be electretized are formed is disposed on the stage 81 by repeating horizontal movements of the stage 81 and up-and-down movements thereof so that the probe pins 70 and 71 can contact pads 40 and 41 of the MEMS microphone chip 43. That electretization apparatus, for instance, may be composed of a wafer prober utilized for such as an electric characteristic inspection in fabricating process of general semiconductor integrated circuits. In such a case, the needle electrode 51 is set above the probe card 75 being movable in perpendicular direction in the wafer prober.

The semiconductor substrate having a plurality of MEMS microphone chips 43 is disposed on the stage 81 in a state that an adhesive sheet 80 is stuck on the back surface (the surface opposite to the surface whereon vibration films 33 is formed) of the semiconductor substrate. Then, a vacuum adhesion system (not shown) provided in the stage 81 fixes the adhesive sheet 80. Only one surface of the adhesive sheet 80 has adhesion. The adhesive sheet 80 is fixed with tension to a ring frame having a larger inside diameter than the external form of the semiconductor substrate, and the semiconductor substrate is stuck on the adhesive surface thereof. The adhesion of the adhesive sheet 80 can be reduced by irradiating with ultraviolet light thereto. The adhesive sheet 80 prevents the vibration film 33 and the like from being damaged by absorption when the semiconductor substrate is fixed to the stage 81. The adhesive sheet 80 further prevents the vibration film 33 and the like from being damaged by absorption when a transferring system to transfer the semiconductor substrate through a substrate inlet and outlet of the electretization apparatus (the wafer prober) transfers the semiconductor substrate.

Further, the above-described electretization apparatus is provided with a cover 57 made of a metal having conductivity to irradiate only a single MEMS microphone chip (the MEMS microphone chip 43*a* in FIG. 3) with ions resulting from a corona discharge of the needle electrode 51. In this embodiment, the cover 57 is arranged along the opening of the probe card 75 and is connected to the ground potential through a resistor 58 having relatively high resistance of approximately tens of M ohm. The cover 57, which is a frame shape with a square opening corresponding to the plane shape of the MEMS microphone chip 43*a*, shields a path of ions moving to MEMS microphone chips (MEMS microphone chips 43*b* and 43*c* in FIG. 3) adjacent to the MEMS microphone chip 43*a* to be electretized (hereinafter referred to as the chip 43*a* to be electretized) on the semiconductor substrate. In this embodiment, frosted black coating is applied to the back surface of the cover 57 in order not to block a needle inspection in an alignment of the wafer prober.

When the MEMS microphone chip 43 is electretized using the above-described electretization apparatus, the semiconductor substrate having a plurality of MEMS microphone chips and being stuck to the adhesive sheet 80 is disposed and held on the stage 81. Then, the stage 81 moves horizontally so that a first chip 43*a* to be electretized locates directly below the opening of the cover 57. At this time, the needle electrode 51 opposes to the chip 43*a* to be electretized through the opening of the cover 57. Thereafter, the stage 81 rises so that the probe pins 70 and 71 contact the pads 40 and 41 of the chip 43*a* to be electretized.

When the probe pins 70 and 71 contact the pads 40 and 41, the variable voltage power source 55 applies a voltage to give a potential difference between probe pins 70 and 71. As described above, the pad 40 in contact with the probe pin 70 is electrically connected to a fixed electrode 31 (see FIG. 1) and the pad 41 in contact with the probe pin 71 is electrically connected to a vibration film 33 (see FIG. 1), thereby the variable voltage power source 55 gives the potential difference between the fixed electrode 31 and the vibration film 33.

In such a state, the high voltage power source 53 applies a voltage to the needle electrode 51, thereby causing a corona discharge thereto. In the electretization apparatus as shown in FIG. 3, a negative potential is applied to the needle electrodes 51 and the fixed electrode 31 and the ground potential is applied to the vibration film 33. Thus, an inorganic dielectric film 32 is irradiated with negative ions resulting from the corona discharge through acoustic holes 35 (see FIG. 1) provided in the fixed electrode 31 in the chip 43*a* to be electretized. As the electretization of the inorganic dielectric film 32 develops, the potential difference between the fixed electrode 31 and the inorganic dielectric film 32 decreases. When the potential difference between the fixed electrode 31 and the inorganic dielectric film 32 comes to zero in the end, negative ions resulting from the corona discharge do not reach the inorganic dielectric film 32. In this manner, the inorganic dielectric film 32 in the chip 43*a* to be electretized is electretized by negative ions by utilizing the electretization apparatus in this embodiment. Further, in a structure wherein a negative potential is applied to the fixed electrode 31, it may be suppressed that negative ions instantly reach the inorganic dielectric film 32 in the chip 43*a* to be electretized in the corona discharge and the inorganic dielectric film 32 receives charges to be deposited that greatly exceeds a desired amount of charges to be deposited. Preferably, each probe pin 70 and 71 is arranged to the probe card 75 so as not to cut across above the fixed electrode 31 in the chip 43*a* to be electretized in order not to prevent ions resulting from the corona discharge by the needle electrode 51 from reaching the inorganic dielectric film 32.

The semiconductor substrate (the MEMS microphone chip 43) may be charged with static electricity before being electretized (for example, in a process that the adhesive sheet 80 is stuck on the back surface of the semiconductor substrate). In case of being charged with the static electricity, an amount of charges to be deposited may not reach a desired amount of charges. In order to remove the static electricity, when the probe pins 70 and 71 contact pads 40 and 41, the variable voltage source 55 preferably first applies the ground potential (zero volt) to the fixed electrode 31 and the vibration film 33 before applying the potential difference as discussed above.

When the electretization of the inorganic dielectric film 32 is completed after enough time is passed to deposit the desired amount of charges, the stage 81 goes down and moves horizontally so that a MEMS microphone chip adjacent to the MEMS microphone chip completed the electretization on the semiconductor substrate locates directly below the opening of the cover 57. Then, the stage 81 goes up and the MEMS microphone chip is electretized using the above-discussed manner.

As discussed above, a use of the electretization apparatus according to this embodiment allows successive process of electretization to a plurality of MEMS microphone chips incorporated on the semiconductor substrate.

When the MEMS microphone chip 43 is of a different type, the amount of charges to be deposited to the inorganic dielectric film 32 varies. Therefore, it may be considered that time to deposit the desired amount of charges is excessively shortened or made longer. Controlling the amount of charges to be deposited would be difficult when the time to deposit the desired amount of charges is excessively shortened, and throughput of electretization would be decreased when the time to deposit the desired amount of charges is excessively made longer. However, the time to deposit the desired amount of charges is made longer when the distance between the surface of the semiconductor substrate and the needle electrode 51 is made longer, and the time is shorten when the distance is shortened. Therefore, changing the distance between the surface of the semiconductor substrate and the needle electrode 51 depending on types of the MEMS microphone chips 43 realizes the electretization performed in a proper time. In the above-discussed electretization apparatus, for instance, the distance between the semiconductor substrate and the needle electrode 51 can be easily adjusted by setting a scale (marks) to specify the height from the surface of the semiconductor substrate disposed on the stage 81.

On the other hand, in the period until the next MEMS microphone chip starts to be electretized after a completion of the electretization of a single MEMS microphone chip, the probe pins 70 and 71 are irradiated with ions resulting from the corona discharge and current flows to the probe pins 70 and 71, and that may cause oxidation of tips of the probe pins 70 and 71. In case that such oxidation is developed, it is not preferable since a contact resistance between the probe pins 70 and 71 and the pads 40 and 41 formed on the MEMS microphone chip would be increased. In order not to oxide the probe pins 70 and 71, it is preferable that the corona discharge of the needle electrode 51 is stopped in the period until the next MEMS microphone chip starts to be electretized after the completion of the electretization of the single MEMS microphone chip. In the meantime, in case that a period to stop the corona discharge is short or it is difficult to stop the corona discharge by controlling the high voltage power source 53, an ion shielding shutter 54 made of a metal having conductivity may be set to be movable between the opening of the cover 57 and the needle electrode 51 as shown in FIG. 3. The ion shielding shutter 54 is set to be movable on and out of paths of ions resulting from the corona discharge to reach the semiconductor substrate (FIG. 3 shows the ion shielding shutter 54 interposed on the path of ions). In this structure, interposing the ion shielding shutter 54 between the opening of the cover 57 and the needle electrode 51 prevents the probe pins 70 and 71 from being irradiated with ions resulting from the corona discharge only in the period until the next MEMS microphone chip starts to be electretized after the completion of the electretization of the single MEMS microphone chip. When such ion shielding shutter 54 is set, it is possible to irradiate with ions after the potential difference is given between the fixed electrode 31 and the vibration film 33 under the conditions that ions irradiation is not performed. As shown in FIG. 3, the ground potential is supplied to the ion shielding shutter 54.

In this embodiment, the number of chips to be electretized by the corona discharge at a time is limited to a single chip due to an application of a voltage to the probe pins 70 and 71 and the cover 57. Thus, each of a plurality of the MEMS microphone chips formed on the semiconductor substrate can be electretized with the predetermined amount of deposited charges. In this embodiment, ions are entered to the inorganic dielectric film 32 between the fixed electrode 31 and the vibration film 33 using the potential difference given between the fixed electrode 31 and the vibration film 33. Therefore, even if the cover 57 is not set, the inorganic dielectric film 32 between the fixed electrode 31 and the vibration film 33 given the potential difference is selectively electretized. The time to electretizing the inorganic dielectric film 32 can be adjusted by the time to give the potential difference.

Further, in the electretization process in a fabricating method of ultra-small condenser microphones in this embodiment, the adhesive sheet to strengthen is stuck on the back surface of the semiconductor substrate wherein a plurality of MEMS microphone chips is incorporatedly formed, and electretization is performed in the state of the substrate. Therefore, it is not necessary to transfer diced partially fabricated MEMS microphones one by one as practiced conventionally, and a plurality of ultra-small condenser microphones is successively electretized in a short time. Also, a wafer prober utilized generally in a fabricating process of semiconductor integrated circuits can be used for the electretization, thereby reducing an equipment cost.

Incidentally, the inorganic dielectric film 32 provided in the chip 43*a* to be electretized is irradiated with negative ions in the above-described electretization apparatus. However, even when the inorganic dielectric film 32 is electretized by irradiating with positive ions, a same property as the MEMS microphone is obtained.

Figure 4:
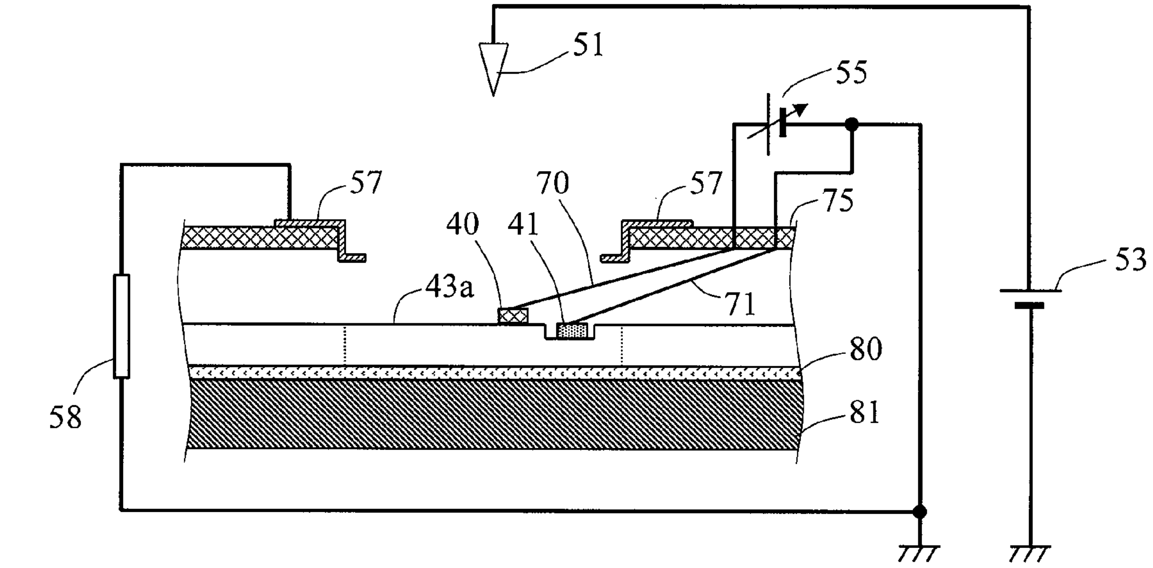
FIG. 4 is a cross-sectional view showing a principal part of a modification of an electretization apparatus that relates to the first embodiment of the present invention.

FIG. 4 is a schematic cross-sectional view illustrating a principal part of an electretization apparatus utilized in an electretization process in case an inorganic dielectric film 32 provided in a chip 43*a* to be electretized is electretized by irradiating with positive ions. In FIG. 4, components having the same function as those in FIG. 3 are referred to by the same reference numbers.

The electretization apparatus shown in FIG. 4 differs from the electretization apparatus shown in FIG. 3 in that a high voltage power source 54 applies a positive potential to a needle electrode 51. Additionally, a polarity of a potential difference that a variable voltage power source 55 connected between probe pins 70 and 71 gives between the probe pins 70 and 71 is reversed as compared with the electretization apparatus shown in FIG. 3. That is, the positive potential is applied to the fixed electrode 31 and the ground potential is applied to the vibration film 33. The inorganic dielectric film 32 provided in the chip 43*a* to be electretized can be electretized with positive ions by utilizing the same method as discussed above using this electretization apparatus.

Each of the MEMS microphone chips electretized in the electretization apparatuses shown in FIG. 3 or 4 is diced into individual MEMS microphone chips after completing the electretization of all of the MEMS microphone chips on the semiconductor substrate. In other words, the semiconductor substrate wherein a plurality of MEMS microphone chips 43 is formed is separated. Such separation of the semiconductor substrate, however, may be performed in the period until the electretization described above is performed after the semiconductor substrate wherein a plurality of MEMS microphone chips 43 is formed is stuck to an adhesive sheet 80. Even in such a case, the electretization apparatus discussed above can successively electretizes each MEMS microphone chip in a short time as the same manner as the state of the substrate.

Figure 5:
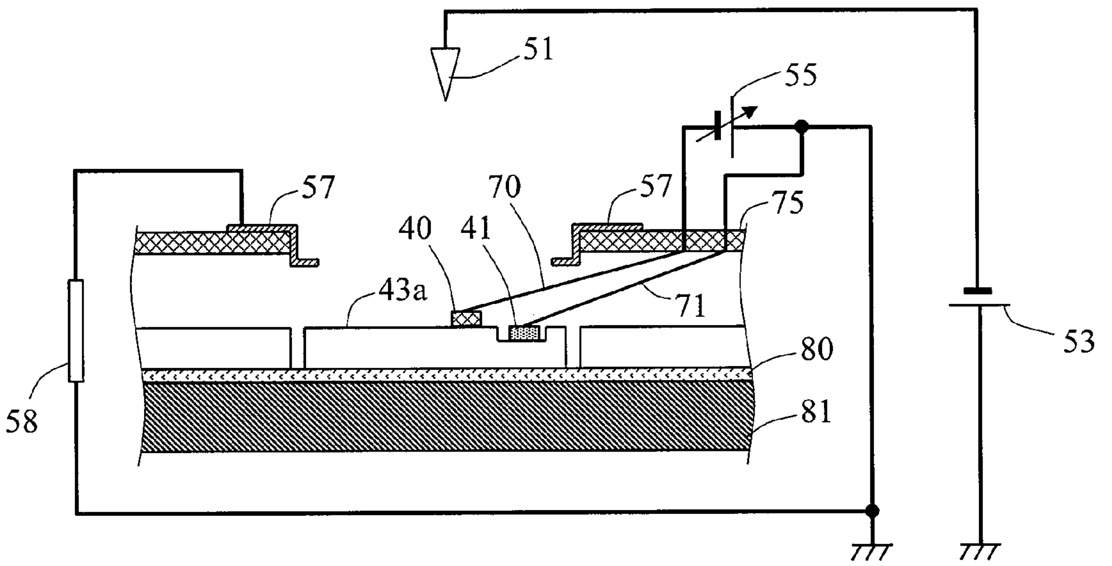
FIG. 5 is a cross-sectional view showing a principal part showing a state that a separated semiconductor substrate is measured in an electretization apparatus relating to the first embodiment of the present invention.

The FIG. 5 shows a process of an electretization of each MEMS microphone chip after a semiconductor substrate is separated. An electretization apparatus shown in FIG. 5 is substantially the same as those shown in FIG. 3 or 4. In this case, the semiconductor substrate wherein a plurality of MEMS microphone chips 43 is formed is stuck to an adhesive sheet 80, and the substrate is separated to a respective MEMS microphone chip 43. At this time, the separated respective MEMS microphone chip 43 is stuck to the adhesive sheet 80. Thus, although the respective MEMS microphone chip is separated to one by one, these are held together by the adhesive sheet 80 so that the external form of the semiconductor substrate is maintained. Therefore, MEMS microphone chips are successively electretized as discussed above by disposing and holding the adhesive sheet 80 sticking each of the separated MEMS microphone chip 43 on the stage 81.

Second Embodiment

Figure 6:
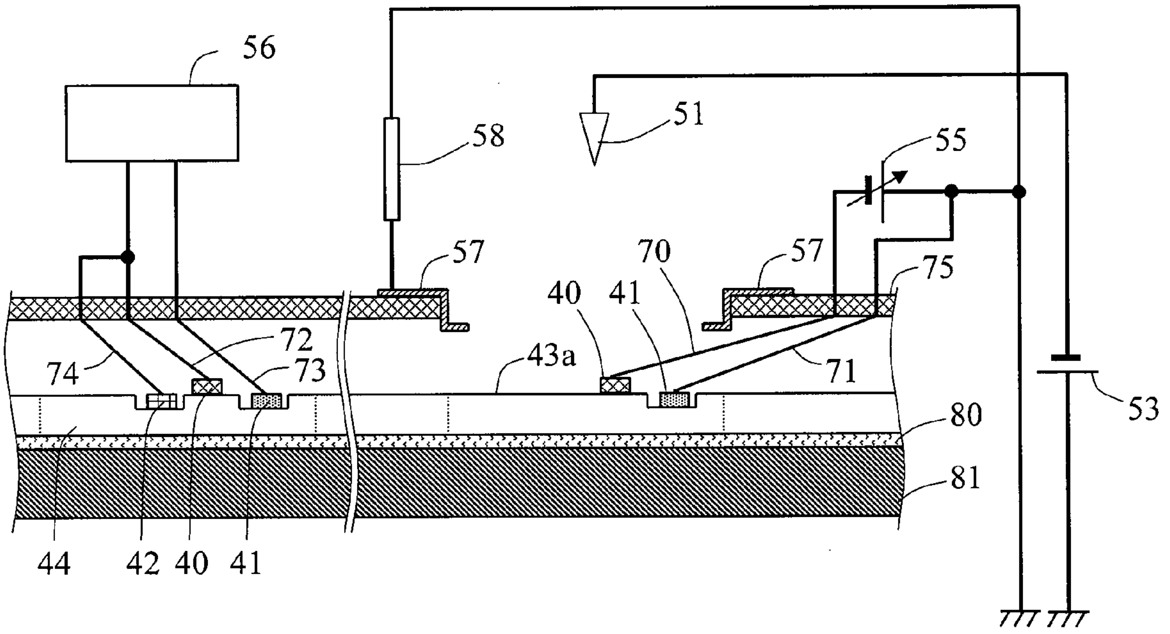
FIG. 6 is a cross-sectional view showing a principal part of an electretization apparatus that relates to the second embodiment of the present invention.

FIG. 6 is a schematic cross-sectional view showing a principal part of a structure of an electretization apparatus used for an electretization process of an ultra-small condenser microphone in accordance with a second embodiment of the present invention. The electretization apparatus shown in FIG. 6 has a structure that a chip 43 to be electretized is electretized and simultaneously an amount of deposited charges of a MEMS microphone chip 44 which has been completed the electretization (hereinafter referred to as the electretized chip 44) on the same semiconductor substrate is inspected. In FIG. 6, a MEMS microphone chip 43 locates several pieces left-hand from a MEMS microphone chip 43*a* as a reference chip on the semiconductor substrate, that is not particularly limited, is regarded as the electretized chip 44. In FIG. 6, components having the same function as those in FIG. 3 are referred to by the same reference numbers.

As shown in FIG. 6, in the electretization apparatus of this embodiment, the probe card 75 contains probe pins 72, 73 and 74 in addition to the structure of the electretization apparatus in FIG. 3 as discussed above. The probe pins 72, 73 and 74 are arranged corresponding to the positions of pads 40, 41 and 42 provided on the electretized chip 44. Each of the probe pins 72, 73 and 74 is connected to an inspection apparatus 56 that measures an amount of deposited charges. In this embodiment, a built-in camera in the wafer prober checks a state of contacts of the probe pins 72, 73 and 74 in the probe card 75 with the pads 40, 41 and 42 so that openings are not provided adjacent to the probe pins 72, 73 and 74 in the probe card 75.

When the probe pins 70 and 71 contact the pads 40 and 41 on the chip 43*a* to be electretized in this electretization apparatus, each of the probe pins 72, 73 and 74 contacts each of the pads 40, 41 and 42 on the electretized chip 44 corresponding to the chip 43*a* to be electretized. Therefore, the probe pin 72 is connected to the fixed electrode 31 of the electretized chip 44, the probe pin 73 is connected to the vibration film 33 of the electretized chip 44 and the probe pin 74 is connected to the base 34 of the electretized chip 44, respectively.

The inspection apparatus 56 measures capacitance of the condenser constituting the MEMS microphone in a state that a potential difference is given between the probe pins 72 and 73. In other words, the capacitance of the condenser constituted by the fixed electrode 31, the vibration film 33 and the inorganic dielectric film 32 is measured in the electretized chip 44 in the state that the potential difference is given between the fixed electrode 31 and the inorganic dielectric film 32. The capacitance of the condenser is measured in a state that a different potential difference is successively given between the fixed electrode 31 and the vibration film 33. The inspection apparatus 56 that measures the amount of deposited charges applies the equivalent potential to the probe pins 72 and 74 when the capacitance is inspected. Thus, the fixed electrode 31 and the base 34 (a silicon substrate) have the equivalent potential so as to stably measure the capacitance. For instance, when the potential applied to the fixed electrode 31 and the base 34 is fixed to the ground potential, a potential ranging from negative to positive is applied to the vibration film 33.

Figure 7:
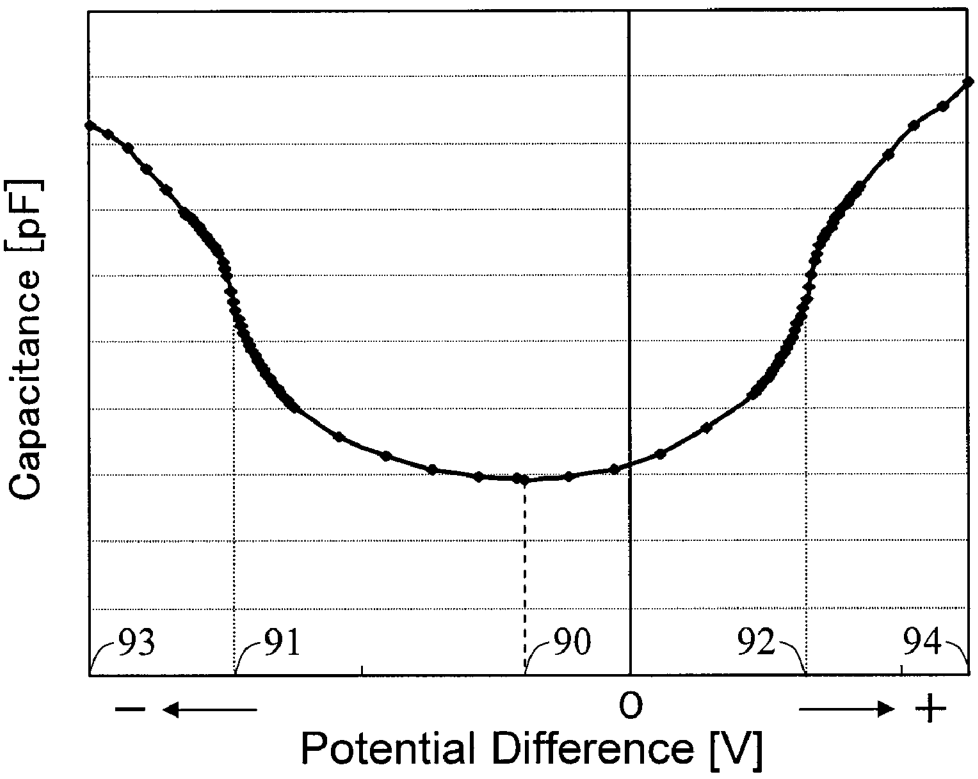
FIG. 7 is a graphical representation showing a capacitance obtained by an inspection of an amount of deposited charges that relates to the second embodiment of the present invention.

FIG. 7 is a graphical representation showing the capacitance obtained by the inspection of measuring the amount of deposited charges using the electretization apparatus shown in FIG. 6. In FIG. 7, an abscissa axis corresponds to the potential difference given between the fixed electrode 31 and the vibration film 33, and an ordinate axis corresponds to the capacitance. A potential difference of 0V in the abscissa axis in FIG. 7 indicates that the fixed electrode 31 and the vibration film 33 have an equivalent potential.

As shown in FIG. 7, the capacitance measured by the inspection apparatus 56 varies according to the potential difference given between the fixed electrode 31 and the vibration film 33. That originates from a generation of electrostatic absorption power between the fixed electrode 31 and the vibration film 33 caused by the potential difference given between the fixed electrode 31 and the vibration film 33. In other words, the vibration film 33 deflects toward the fixed electrode 31 due to the absorption power so that a distance between the vibration film 33 and the fixed electrode 31 (an interelectrode distance) varies. As a result, the capacitance changes to a U-shape according to changes of the potential differences.

In case of a MEMS microphone chip having the inorganic dielectric film 32 which is not electretized, charges are not accumulated to the inorganic dielectric film 32. Thus, when the absolute value of the potential difference between the vibration film 33 and the fixed electrode 31 is equal even though the polarity of the potential difference is opposite, the electrostatic absorption power generated between the vibration film 33 and the fixed electrode 31 becomes almost equal. Therefore, with respect to the MEMS microphone chip having the inorganic dielectric film 32 which is not electretized, when the dependency of the capacitance to the potential difference is obtained, the capacitance is minimized when the potential difference is 0V.

On the other hand, in case of a MEMS microphone chip having the inorganic dielectric film 32 which is electretized, charges are accumulated to the inorganic dielectric film 32. Thus, when the polarity of the potential difference between the vibration film 33 and the fixed electrode 31 is opposite even though the absolute value thereof is equal, the electrostatic absorption power generated between the vibration film 33 and the fixed electrode 31 do not become equal. Therefore, the potential difference when the capacitance is minimized (hereinafter referred to as the minimal potential difference) varies according to the amount of deposited charges in the inorganic dielectric film 32 due to the electretization. As a result, the amount of deposited charges can be inspected (a propriety determination of the amount of deposited charges) by obtaining the minimal potential difference 90 and comparing the minimal potential difference 90 with a predetermined reference value.

In this embodiment, the minimal potential difference 90 is obtained in the following. Here, the right side of the minimal potential difference 90 corresponding to a bottom part of the U-shape in FIG. 7 is expedientially referred to as a positive side and the left side thereof is referred to as a negative side. First, changing the potential difference given between the vibration film 33 and the fixed electrode 31, the inspection apparatus 56 measures the capacitance every time the potential difference is applied so as to obtain a relationship between the capacitance and the potential difference shown in FIG. 7. Here, the minimum potential difference 93 that is the lowest limit in the measuring range and the maximum potential difference 94 that is the upper limit, and these are set in advance in the inspection apparatus 56. Preferably, noises have to be excluded to accurately obtain the relationship between the capacitance and the potential difference. Here, the inspection apparatus 56 excludes an influence of noises by smoothing (leveling) the obtained data.

Next, the inspection apparatus 56 calculates the potential difference 91 (the differential minimum potential difference 91) of which the decreasing rate of the capacitance relative to the increase in potential difference is maximum, and the potential difference 92 (the differential maximum potential difference 92) of which the increasing rate of the capacitance relative to the increase in potential difference is maximum. For instance, the differential minimum potential difference 91 can be found as a potential difference of which a differential value in a curve in FIG. 7 is minimized and the differential maximum potential difference 92 can be found as a potential difference of which a differential value in the curve in FIG. 7 is maximized. Preferably, the inspection apparatus 56 measures the capacitance by reducing a variation of the potential difference around the differential minimum potential difference 91 and the differential maximum potential difference 92 in order to more accurately obtain these potential differences.

Successively, the inspection apparatus 56 calculates an average value (an intermediate value) of the differential minimum potential difference 91 and the differential maximum potential difference 92 as the minimal potential difference 90. The inspection apparatus 56 may calculate the differential minimum potential difference 91 and the differential maximum potential difference 92 in parallel with obtaining the capacitance. Preferably, the inspection apparatus 56 finishes giving the potential difference between the vibration film 33 and the fixed electrode 31 after the vibration film 33 becomes a steady-state (a state that the distance between the fixed electrode 31 and the vibration film 33 is maximum and the capacitance is minimum) through the application of the obtained minimal potential difference 90.

As described above, the electretized chip 44 to be inspected the amount of deposited charges is apart more than one chip from the chip 43*a* to be electretized, because it should be avoided that ions with which the chip 43*a* to be electretized is irradiated reach the electretized chip 44 and are re-deposited to the electretized chip 44 during the inspection. Although the electretization apparatus in this embodiment has the cover 57 so that only the chip 43*a* to be electretized is irradiated with ions in this structure as discussed above, the electretized chip

44 to be inspected the amount of deposited charges is selected in this manner thereby more accurately inspecting the amount of deposited charges.

Figure 8:
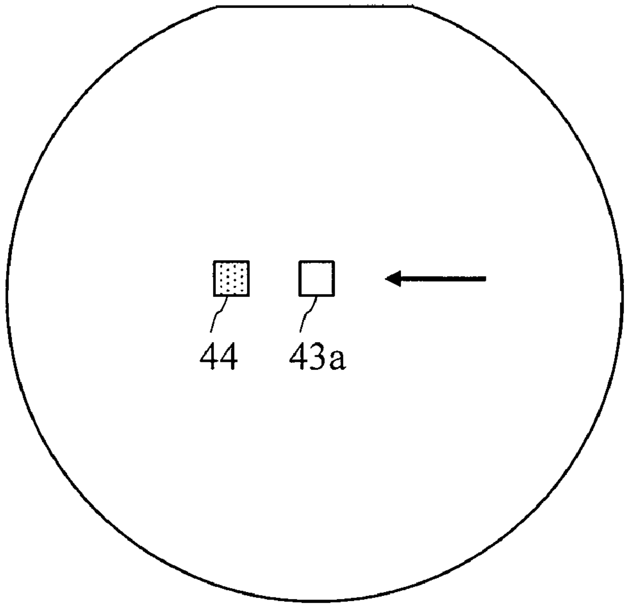
FIG. 8 is a plan view showing an entire semiconductor substrate wherein a plurality of MEMS microphone chips is formed.

FIG. 8 is a plan view showing the entire semiconductor substrate whereon a plurality of MEMS microphone chips is formed. Only two chips are shown in FIG. 8; one is the chip 43*a* to be electretized and the other is the electretized chip 44 which is inspected the amount of deposited charges in parallel with electretization of the chip 43*a* to be electretized. An arrow in FIG. 8 shows a direction of movements of the stage 81 to place next chips directly below each of the probe pins 70 to 74, after the semiconductor substrate is disposed on the stage 81 in the electretization apparatus shown in FIG. 6 and the electretization of the chip 43*a* to be electretized and the inspection of the amount of deposited charges of the electretized chip 44 are completed. In FIG. 8, the stage 81 moves one-chip distance to the left. Then, a MEMS microphone chip adjacent to (the right side in FIG. 8) the MEMS microphone chip which is completed the electretization on the semiconductor substrate is a chip to be electretized next. Further, a MEMS microphone chip adjacent to (the right side in FIG. 8) the MEMS microphone chip which is completed the inspection of the amount of deposited charges on the semiconductor substrate is a chip to be inspected the amount of deposited charges next.

In such a case, the stage 81 can move smoothly particularly when the time to deposit the required amount of charges in the inorganic dielectric film 32 in the electretization process and the time to inspect the amount of deposited charges are equal. Under this condition, the probe pins 70 and 71 set in the same probe card 75 can successively electretizes MEMS microphone chips, and in parallel the amount of deposited charges in electretized MEMS microphone chips can be successively inspected.

As discussed above, in accordance with this embodiment, the amount of charges deposited to the electretized MEMS microphone chips are inspected in parallel with the electretization of MEMS microphone chips to be electretized. Additionally, a wafer prober utilized generally in a fabricating process of semiconductor integrated circuits can be used for the electretization, thereby reducing an equipment cost.

Third Embodiment

In the first and the second embodiments, the electretization is performed by a corona discharge using a needle electrode. The electretization, however, can be performed using a linear electrode in stead of the needle electrode. Thus, the electretization that is performed by a corona discharge using a linear discharge electrode will be discussed in this embodiment.

Figure 9:
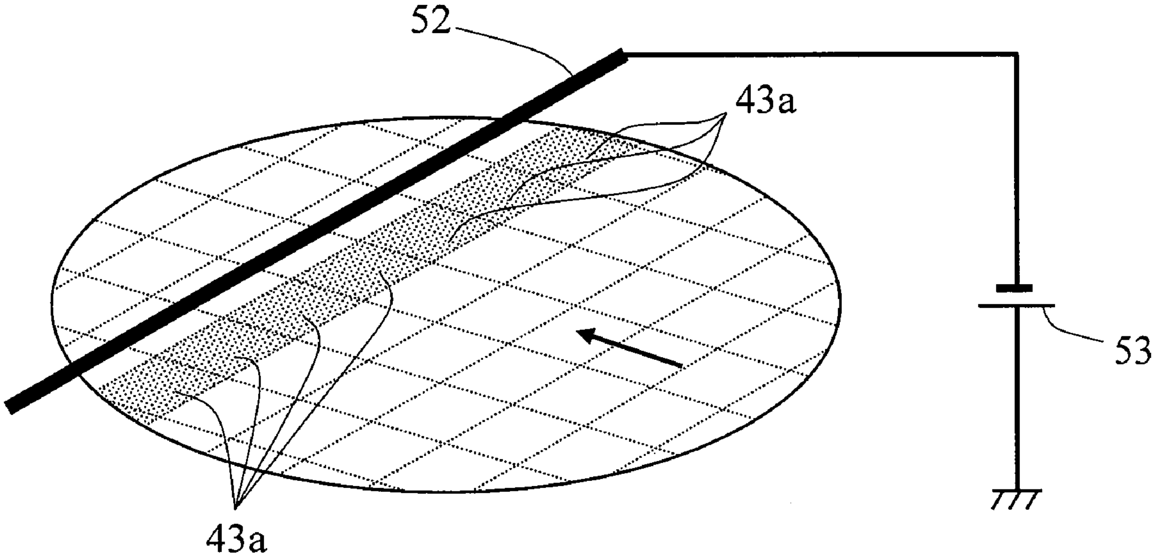
FIG. 9 is an enlarged view showing a principal part of an electretization apparatus that relates to the third embodiment of the present invention.

FIG. 9 is a schematic enlarged view showing a principal part of an electretization apparatus used in an electretization process of an ultra-small condenser microphone in accordance with a third embodiment. The electretization apparatus in FIG. 9 is provided with a wire electrode 52 (discharge electrode) which is a linear-formed in stead of the needle electrode 51 in the electretization apparatus described in the first embodiment. The wire electrode 52 simultaneously irradiates a plurality of MEMS microphone chips 43*a* to be electretized arranged linearly in one direction with ions resulting from a corona discharge on a semiconductor substrate whereon a plurality of MEMS microphone chips 43 is formed. The wire electrode 52 is connected to a negative electrode of a high voltage power source 53 to apply a voltage to generate a corona discharge.

The electretization apparatus in this embodiment has a probe card, although not shown in FIG. 9, wherein a plurality of sets of probe pins to apply the potential as discussed in the first embodiment is fixed. Each set of probe pins contacts the pads 40 and 41 provided in each of chips to be electretized which are simultaneously electretized by the corona discharge of the wire electrode 52 during electretization. The probe card has an opening which is a path of ions resulting from the corona discharge of the wire electrode 52 to reach the semiconductor substrate disposed on the stage 81. The probe card is further provided with a cover made of a metal to shield a path of ions to reach MEMS microphone chips adjacent to a plurality of chips 43*a* to be electretized on the semiconductor substrate. In this case, the cover is a frame-shaped component having a rectangular-shaped opening corresponding to a plane shape of outer edges of a plurality of MEMS microphone chips to be simultaneously electretized. Other structures of the electretization apparatus in this embodiment are the same as those described in the first embodiment.

When the MEMS microphone chips 43 are electretized using the electretization apparatus, the semiconductor substrate having a plurality of MEMS microphone chips and being stuck to an adhesive sheet is disposed and held on the stage 81. Then, the stage 81 moves horizontally so that the wire electrode 52 is located above a plurality of chips 43*a* to be electretized which are arranged in a line on the semiconductor substrate. After that, the stage 81 rises so that the pads 40 and 41 provided in each of the plurality of MEMS microphone chips 43*a* to be electretized contact the probe pins in the probe card.

When the probe pins contact the pads 40 and 41 on each of the chips 43*a* to be electretized, the potential difference discussed in the first embodiment is given between a fixed electrode 31 and a vibration film 33 on each of the chips 43*a* through the probe pins. Under the state, the high voltage power source 53 applies a voltage to the wire electrode 52. Then, a corona discharge is generated from the wire electrode 52. As a result, the plurality of chips 43*a* to be electretized arranged in a line on the semiconductor substrate is simultaneously electretized.

The semiconductor substrate is moved one after another, in a direction shown by an arrow in FIG. 9, every time the amount of charges needed by the inorganic dielectric film 32 is deposited or, in other words, every time electretization is completed so that a plurality of chips 43*a* to be electretized can be continuously electretized.

In this embodiment, electretization can be simultaneously performed to a plurality of MEMS microphone chips, thereby enhancing a throughput of the electretization as compared with the first embodiment. Therefore, in addition to the effects obtained in the first embodiment, an effect of increasing in productivity can be obtained. The electretization apparatus in this embodiment can employ a structure wherein the electretization is performed in parallel with an inspection of an amount of deposited charges as discussed in the second embodiment. In such a case, it is preferable that the amount of deposited charges is simultaneously inspected in terms of a plurality of the MEMS microphone chips which is simultaneously electretized.

Fourth Embodiment

In the third embodiment, the structure wherein a plurality of chips to be electretized is simultaneously electretized using a wire electrode has been discussed. However, even using a needle discharge electrode, a plurality of chips to be electretized can be simultaneously electretized.

Figure 10A:
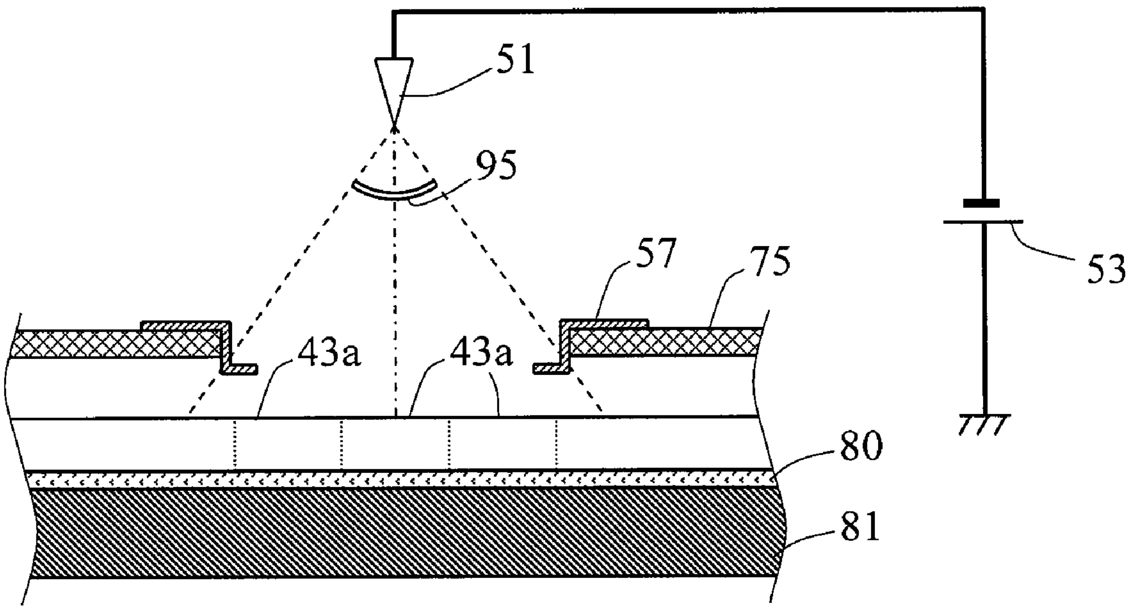
FIGS. 10A and 10B are a view showing a structure of a principal part of an electretization apparatus that relates to the fourth embodiment of the present invention.
Figure 10B:
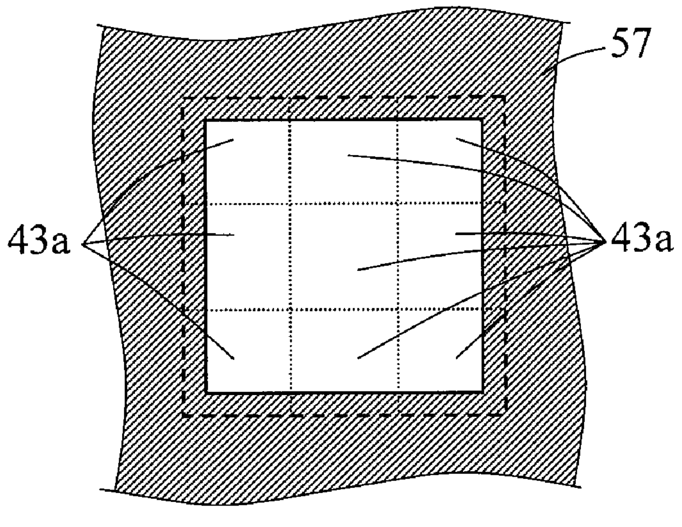

FIG. 10A is a schematic cross-sectional view showing a principal part of an electretization apparatus used in an electretization process of an ultra-small condenser microphone in accordance with a fourth embodiment, and FIG. 10B is a plan view showing a principal part thereof. As shown in FIGS. 10 (*a*) and 10 (*b*), a structure of a cover 57 in the electretization apparatus in this embodiment differs from that in the electretization apparatus in the first embodiment. The cover 57 provided in the electretization apparatus in this embodiment has an opening in order that ions resulting from a corona discharge reach only a plurality of MEMS microphone chips, and all of the plurality of the MEMS microphone chips are contained within an area on the semiconductor substrate whereon irradiation with ions resulting from the corona discharge of a needle electrode 51 is performed (within a circle on the semiconductor substrate, a center of which is an intersection point of a perpendicular line pulled down from a tip of the needle electrode 51, corresponding to an angle 95 to discharge ions irradiated by the needle electrode 51). As shown in FIG. 10B, regarding a chip presented at the intersection point of the perpendicular line pulled down from the tip of the needle electrode 51 as the center chip, the cover 57 has a rectangular opening corresponding to the outer edges of nine pieces of the MEMS microphone chips which are distributed point symmetry with respect to the center chip within the area.

The electretization apparatus in this embodiment also has a probe card wherein a plurality of sets of probe pins to apply the potential as discussed in the first embodiment is fixed. Each set of probe pins contacts the pads 40 and 41 provided in each of chips 43*a* to be electretized which are simultaneously electretized by the corona discharge of the needle electrode 51 during electretization. The probe card has an opening which is a path of ions resulting from the corona discharge of the needle electrode 51 to reach the semiconductor substrate disposed on the stage 81. Other structures of the electretization apparatus in this embodiment are the same as those described in the first embodiment.

When the MEMS microphone chips 43 are electretized using the electretization apparatus, the semiconductor substrate having a plurality of MEMS microphone chips and being stuck to an adhesive sheet is disposed and held on the stage 81. Then, the stage 81 move horizontally so that the needle electrode 51 is located above a plurality of chips 43*a* to be simultaneously electretized (here, above the center chip of the nine pieces of the MEMS microphone chips). After that, the stage 81 rises so that the pads 40 and 41 provided in each of the plurality of MEMS microphone chips 43*a* to be electretized contact the probe pins in the probe card.

When the probe pins contact the pads 40 and 41 on each of the chips 43*a* to be electretized, the potential difference discussed in the first embodiment is given between a fixed electrode 31 and a vibration film 33 on each of the chips 43*a* through the probe pins. Under the state, the high voltage power source 53 applies a voltage to the needle electrode 51. Then, a corona discharge is generated from the needle electrode 51. As a result, the plurality of chips 43*a* to be electretized contained within the area on the semiconductor substrate whereon irradiation with ions resulting from the corona discharge of the needle electrode 51 is performed is simultaneously electretized.

The semiconductor substrate is moved one after another every time the amount of charges needed by the inorganic dielectric film 32 is deposited or, in other words, every time the electretization is completed so that a plurality of chips 43*a* to be electretized can be continuously electretized.

In this embodiment as well as the third embodiment, the electretization is simultaneously performed to a plurality of MEMS microphone chips, thereby enhancing a throughput of the electretization as compared with the first embodiment. Therefore, in addition to the effects obtained in the first embodiment, an effect of increasing in productivity can be obtained. The electretization apparatus in this embodiment can employ a structure wherein the electretization is performed in parallel with an inspection of an amount of deposited charges as discussed in the second embodiment. In such a case, it is preferable that the amount of deposited charges is simultaneously inspected in terms of a plurality of the MEMS microphone chips which is simultaneously electretized.

In this embodiment, the plurality of sets of probe pins is provided in order to simultaneously electretize a plurality of the MEMS microphone chips. Thus, in electretizing a MEMS microphone chip formed on the outer edge part on the semiconductor substrate, a few probe pins could be exposed to ions without contacting pads of the MEMS microphone chips. When current flows to such probe pins by irradiating with ions, tips of the probe pins could be oxidized as discussed above. Therefore, in this embodiment, in electretizing MEMS microphone chips formed on the outer edge part on the semiconductor substrate, the potential difference as described above is applied only to the probe pins which contact the MEMS microphone chips to be electretized.

Figure 11:
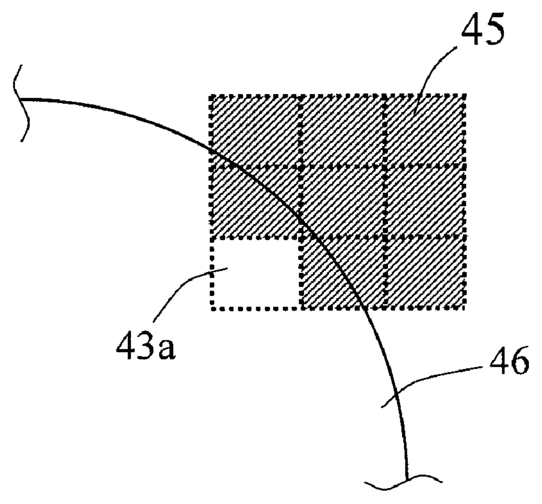
FIG. 11 is a schematic view showing a positional relationship between probe pins and a MEMS microphone chip on a semiconductor substrate.
Figure 12:
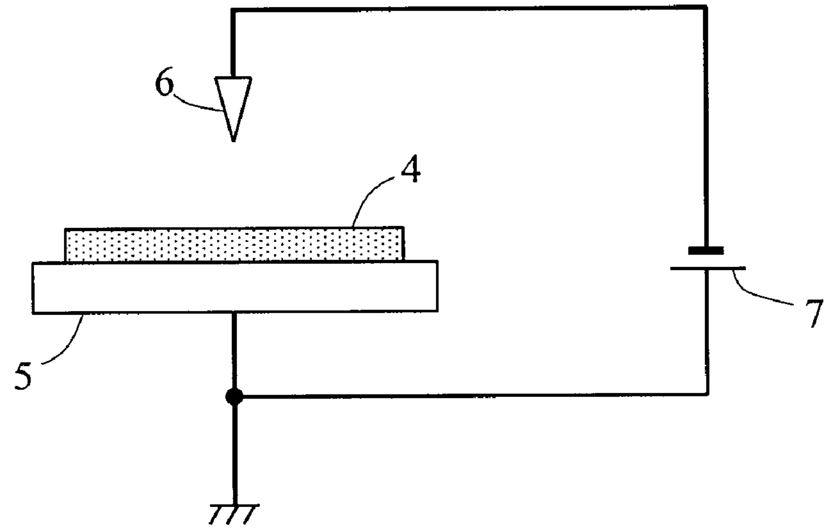
Fig. 12 (PRIOR ART)
FIG. 12 is a cross-sectional view showing a principal part of a conventional electretization apparatus.

FIG. 11 schematically shows a positional relationship between each set of probe pins and the MEMS microphone chip on the semiconductor substrate when MEMS microphone chips in the outer edge of the semiconductor substrate is electretized. Only one set of probe pins among nine sets of probe pins contact a chip 43*a* to be electretized on a semiconductor substrate 46 in FIG. 11. In FIG. 11, each set of probe pins is shown by illustrating external forms of the MEMS microphone chips with a rectangular shape drawn by broken lines whereto each set of probe pins applies a potential difference.

As shown in FIG. 11, this embodiment employs a structure wherein the potential difference as discussed above is not applied to the probe pins (the probe pins belong to a region 45 filled with slanted lines in FIG. 11) which do not contact any MEMS microphone chip to be electretized. Here, interposing a relay and the like between each set of probe pins and a variable voltage power source 55 (see FIG. 3), the relay and the like cut an electrical connection between each set of probe pins and the variable voltage power source 55. The relay which is an object to be cut will be easily specified based on position coordinate information of the MEMS microphone chip to be electretized on the semiconductor substrate 46 outputted from the wafer prober. Further, the relay and the like, for instance, can be arranged on the probe card or on a board connected to the probe card. In accordance with this structure, the probe pins which are not on the MEMS microphone chip to be electretized can be in an electrically-open state, thereby preventing the tips of the probe pins from oxidizing. This method of preventing oxidization is as a matter of course applicable to the electretization apparatus discussed in the third embodiment.

In accordance with the present invention as discussed above, electretization of each of ultra-small condenser microphones is successively performed in short time, thereby increasing productivity of ultra-small condenser microphones significantly. Further, although a handler equipment on the market and the like which are frequently used for inspections of semiconductor integrated circuit devices in a state that an ultra-small condenser microphone is diced cannot be utilized as the diced ultra-small condenser microphones are damaged in the prior art, a wafer prober on the market frequently used for inspections of a state of a substrate of semiconductor integrated circuit devices can be used in accordance with the present invention. Therefore, an equipment cost can be reduced.

The embodiments discussed above do not restrict the technical range of the present invention and various modifications and applications can be available within the effective range of the present invention besides the embodiments discussed above. For example, although a dielectric film to be electretized is an inorganic dielectric film in the above description, the present invention is applicable in case that a dielectric film to be electretized is an organic dielectric film.

The present invention contributes to an increase in productivity of electretization of MEMS microphone chips fabricated using a fine processing technology and reduction of equipment costs, and is useful as fabricating method of ultra-small condenser microphones used for fabricating micro-miniature sized MEMS microphones equipped in mobile communication devices.

What is claimed is:

1. A method of fabricating a condenser microphone, comprising the steps of:

forming a plurality of condenser microphones, each of the condenser microphones including a semiconductor substrate, a fixed electrode arranged opposite a vibration electrode via a space and a dielectric film arranged between the fixed and vibration electrodes, the fixed electrode and the vibration electrode being disposed on the semiconductor substrate;

sticking a sheet on a first surface of the semiconductor substrate, the first surface being opposite to a second surface on which the vibration electrode is formed;

disposing the condenser microphone facing a discharge electrode; and performing electretization for fixing charges in the dielectric film by irradiating the dielectric film arranged between the fixed electrode and the vibration electrode provided in a condenser microphone on the semiconductor substrate with ions generated from the discharge electrode in a state that a predetermined potential difference is given between the fixed electrode and the vibration electrode, and wherein the electretization for the dielectric film provided in the plurality of the condenser microphones on the semiconductor substrate is successively performed by relatively moving the semiconductor substrate and the discharge electrode.

2. A method according to claim 1, wherein the semiconductor substrate and the discharge electrode move relatively in a time interval of that an amount of charges deposited in the dielectric film reaches a predetermined amount, and the electretization for the dielectric film provided in the plurality of the condenser microphones on the semiconductor substrate is performed continuously.

3. A method according to claim 1, wherein the discharge electrode is a needle electrode.

4. A method according to claims 1, wherein the condenser microphone to be electretized is selected by giving the potential difference between the fixed electrode and the vibration electrode and a time to electretize is adjusted with a time to give the potential difference.

5. A method according to claim 1, wherein static electricity is removed by giving a ground potential to the fixed electrode and the vibration electrode before giving the potential difference between the fixed electrode and the vibration electrode.

6. A method according to claim 1, further comprising the step of:

separating the semiconductor substrate stuck on the sheet into pieces on the sheet; and wherein the electretization is performed in a state that the pieces are held together by the sheet.

7. A method according to claim 1, wherein the discharge electrode is arranged in a wafer prober, and the semiconductor substrate wherein the plurality of the condenser microphone is formed is disposed on a stage provided in the wafer prober.

8. A method according to claim 1, further comprising a step of:

after the electretization step, inspecting an amount of charges deposited in the dielectric film provided in a first condenser microphone completed the electretization in parallel with the electretization to the dielectric film in a second condenser microphone, the first and the second condenser microphones being included in the plurality of the condenser microphones on the semiconductor substrate; and wherein the inspection of the amount of deposited charges in the dielectric film provided in each of the plurality of the condenser microphones is successively performed by relatively moving the semiconductor substrate and the discharge electrode.

9. A method according to claim 8, wherein the semiconductor substrate and the discharge electrode move relatively in a time interval required for the inspection of the amount of deposited charges, and the electretization for the dielectric film provided in the plurality of the condenser microphones on the semiconductor substrate and the inspection of the amount of deposited charges in the dielectric film completed the electretization on the semiconductor substrate is performed continuously.

10. A method according to claim 8, wherein at least one or more condenser microphone chips are interposed between a condenser microphone to be electretized and a condenser microphone to be inspected the amount of deposited charges in parallel with the electretization on the semiconductor substrate.

11. A method according to claim 8, wherein the discharge electrode is a needle electrode.

12. A method according to claim 8, wherein the condenser microphone to be electretized is selected by giving the potential difference between the fixed electrode and the vibration electrode and a time to electretize is adjusted with a time to give the potential difference.

13. A method according to claim 8, wherein static electricity is removed by giving a ground potential to the fixed electrode and the vibration electrode before giving the potential difference between the fixed electrode and the vibration electrode.

14. A method according to claim 8, wherein the predetermined potential difference is given between the fixed electrode and the vibration electrode through probe pins.

15. A method according to claim 8, wherein the inspection of the amount of deposited charges is performed through probe pins.

16. A method according to claim 8, further comprising the step of:

separating the semiconductor substrate stuck on the sheet into pieces on the sheet; and wherein the electretization is performed in a state that the pieces are held together by the sheet.

17. A method according to claim 8, wherein the discharge electrode is arranged in a wafer prober, and the semiconductor substrate wherein the plurality of the condenser microphone is formed is disposed on a stage provided in the wafer prober.

18. A method according to claim 8, wherein a distance between the semiconductor substrate and the discharge electrode is adjustable.

19. A method according to claim 8, wherein the inspecting step comprises the steps of:

changing the potential difference given between the fixed electrode and the vibration electrode in one direction within a predetermined range; and measuring a capacitance of a condenser composed of the fixed electrode and the vibration electrode in every potential difference.

20. A method according to claim 19, wherein a potential difference of which a decreasing rate of the capacitance relative to the increase in the potential difference is maximum and a potential difference of which an increasing rate of the capacitance relative to the increase in the potential difference is maximum are obtained based on the measured capacitance, and the amount of deposited charges is inspected based on an intermediate value of the obtained respective potential differences.

21. A method according to claim 20, wherein the capacitance is measured by reducing a variation of the potential difference given between the fixed electrode and the vibration electrode around the potential difference of which the decreasing rate of the capacitance relative to the increase in the potential difference is maximum and the potential difference of which the increasing rate of the capacitance relative to the increase in the potential difference is maximum.

22. A method according to claim 20, wherein, in finishing giving the potential difference to measure the capacitance, giving the potential difference to measure the capacitance is finished after a potential difference corresponding to the intermediate value is given to the fixed electrode and the vibration electrode.

23. A method according to claims 19, wherein, in giving the potential difference to measure the capacitance, the same potential given to the fixed electrode is applied to the semiconductor substrate supporting an outer edge of the vibration electrode.

24. A method according to claim 1, wherein the predetermined potential difference is given between the fixed electrode and the vibration electrode through probe pins.

25. A method according to claim 24, wherein irradiation with the ions on the dielectric film provided in a condenser microphone except for a condenser microphone to be electretized is avoided by using a cover having conductivity provided in a probe card supporting the probe pins and connected to a ground potential through a high resistance.

26. A method according to claim 25, wherein frosted black coating is applied to a surface of the cover opposed to the semiconductor substrate.

27. A method according to claim 24, wherein the probe pins are set through portions except for above the fixed electrode provided in the condenser microphone to be electretized.

28. A method according to claim 24, an ion-shielding shutter having conductivity connected to a ground potential opens/closes a path of ions resulting from the discharge electrode to the semiconductor substrate

29. A method according to claim 1, wherein a distance between the semiconductor substrate and the discharge electrode is adjustable.

30. A method according to claim 29, wherein the distance between the semiconductor substrate and the discharge electrode is adjusted based on a scale which specifies a position of the discharge electrode.

* * * * *